(12) United States Patent
Yoshida et al.

(10) Patent No.: US 10,243,509 B2
(45) Date of Patent: Mar. 26, 2019

(54) PHOTOELECTRIC CONVERSION MODULE GROUP

(71) Applicant: ZEON CORPORATION, Chiyoda-ku, Tokyo (JP)

(72) Inventors: Masayoshi Yoshida, Tokyo (JP); Kiyoshige Kojima, Tokyo (JP); Yuki Hayashi, Tokyo (JP); Midori Yamaai, Tokyo (JP); Akihiko Yoshiwara, Tokyo (JP)

(73) Assignee: ZEON CORPORATION, Chiyoda-ku, Tokyo (JP)

( * ) Notice: Subject to any disclaimer, the term of this patent is extended or adjusted under 35 U.S.C. 154(b) by 0 days.

(21) Appl. No.: 15/559,941

(22) PCT Filed: Mar. 17, 2016

(86) PCT No.: PCT/JP2016/001566
§ 371 (c)(1),
(2) Date: Sep. 20, 2017

(87) PCT Pub. No.: WO2016/157796
PCT Pub. Date: Oct. 6, 2016

(65) Prior Publication Data
US 2018/0076759 A1 Mar. 15, 2018

(30) Foreign Application Priority Data
Mar. 31, 2015 (JP) .................. 2015-071083

(51) Int. Cl.
*H02S 30/20* (2014.01)
*H02S 40/36* (2014.01)
(52) U.S. Cl.
CPC .............. *H02S 30/20* (2014.12); *H02S 40/36* (2014.12)

(58) Field of Classification Search
CPC .................................. H02S 30/20; H02S 40/36
(Continued)

(56) References Cited

U.S. PATENT DOCUMENTS

2008/0236655 A1* 10/2008 Baldwin ............... H01L 31/188
136/251
2008/0245405 A1 10/2008 Garvison et al.
(Continued)

FOREIGN PATENT DOCUMENTS

CN 101138096 A 3/2008
DE 8802500 U1 5/1988
(Continued)

OTHER PUBLICATIONS

Oct. 3, 2017, International Preliminary Report on Patentability issued in the International Patent Application No. PCT/JP2016/001566.

(Continued)

*Primary Examiner* — Jayne L Mershon
(74) *Attorney, Agent, or Firm* — Kenja IP Law PC

(57) ABSTRACT

Provided is a photoelectric conversion module group that enables a balance of high levels of mechanical strength improvement and weight reduction when thin photoelectric conversion modules are used. The photoelectric conversion module includes: a plurality of photoelectric conversion modules (11); a flexible linking portion (12) that mechanically and electrically connects two adjacent photoelectric conversion modules (11) among the plurality of photoelectric conversion modules (11); a flexible protective member (14) that covers at least one of a front surface and a rear surface of the linking portion (12); and one or more rigid reinforcing members (13) that partially cover the photoelectric conversion modules (11). In a case in which a reinforcing member (13) is present at a rear surface of any of the (Continued)

photoelectric conversion modules (11), the rear surface includes an exposed surface region that is not covered by the reinforcing member (13).

8 Claims, 12 Drawing Sheets

(58) Field of Classification Search
USPC ........................................................ 136/251
See application file for complete search history.

(56) References Cited

U.S. PATENT DOCUMENTS

| 2013/0008483 | A1* | 1/2013 | Chaney | ................ | B32B 37/06 |
| | | | | | 136/245 |
| 2014/0305493 | A1* | 10/2014 | Dhir | ................ | H01L 31/02013 |
| | | | | | 136/251 |

FOREIGN PATENT DOCUMENTS

| JP | H0951118 A | 2/1997 |
| JP | 2006093297 A | 4/2006 |
| JP | 2008533720 A | 8/2008 |
| JP | 2012028427 A | 2/2012 |
| JP | 2012134462 A | 7/2012 |

OTHER PUBLICATIONS

May 17, 2016, International Search Report issued in the International Patent Application No. PCT/JP2016/001566.

Jul. 24, 2018, Extended European Search Report issued by the European Patent Office in the corresponding European Patent Application No. 16771689.3.

* cited by examiner

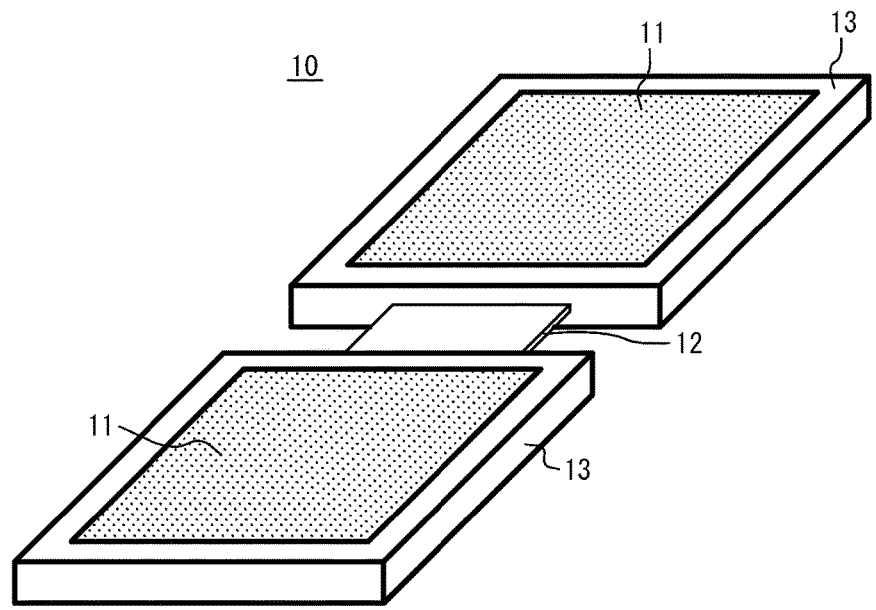
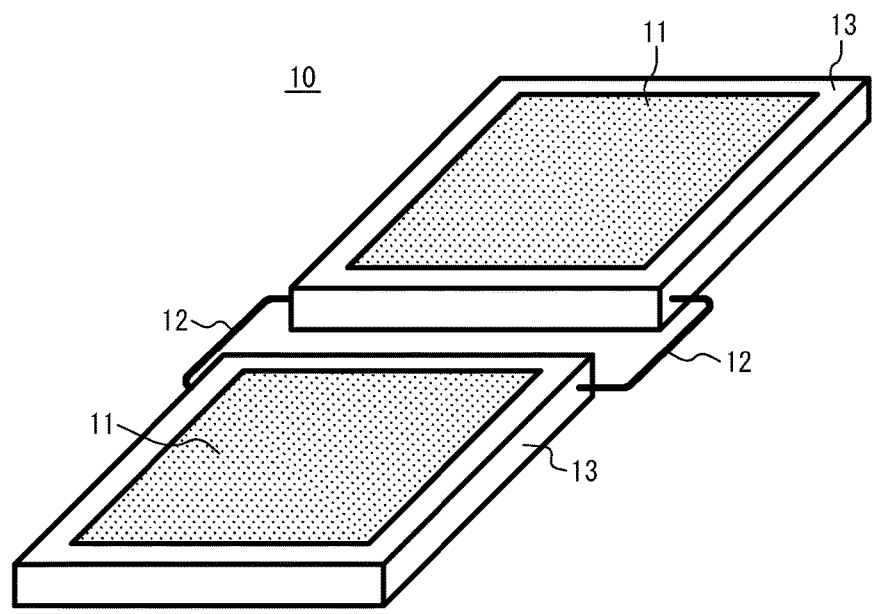

PHOTOELECTRIC CONVERSION MODULE GROUP

TECHNICAL FIELD

This disclosure relates to a photoelectric conversion module group.

BACKGROUND ART

In recent years, there has been increased demand for portable power generating devices that enable users to use portable devices such as smartphones, notebook personal computers (PCs), and tablet PCs even when they go out and do not have access to a commercial power supply.

In one example, PTL 1 discloses a sheet-shaped structure (photoelectric conversion module group) in which a plurality of photoelectric conversion modules (solar cells) arranged with a specific spacing therebetween are connected to one another by a flexible conductive member, and in which the photoelectric conversion modules and the conductive member are sandwiched from above and below by sheet-shaped transparent film members that are flexible and elastic. According to such a sheet-shaped structure, when in use the sheet-shaped structure is widened and enables electrical power generated by the photoelectric conversion modules to be extracted and can be used by an external device. Moreover, when not in use the sheet-shaped structure can be folded to facilitate storage and transport.

CITATION LIST

Patent Literature

PTL 1: JP H9-51118 A

SUMMARY

Technical Problem

In order to develop thinner and lighter photoelectric conversion module groups with the aim of improving portability thereof, there is a need for thinner photoelectric conversion modules. However, simply making photoelectric conversion modules thinner may lead to warping or breaking of the photoelectric conversion modules due to stress imparted on the photoelectric conversion modules during folding.

In the invention described in PTL 1, the mechanical strength of thin solar cells is increased by providing metal reinforcing plates of roughly the same size as the solar cells at a specific spacing in accordance with the positioning of the solar cells. However, the inclusion of such reinforcing plates is problematic because it increases the weight and reduces the portability of a photoelectric conversion module group.

An objective of this disclosure is to solve the problems set forth above and provide a photoelectric conversion module group that enables a balance of high levels of mechanical strength improvement and weight reduction when thin photoelectric conversion modules are used.

Solution to Problem

This disclosure aims to advantageously solve the problems set forth above by disclosing a photoelectric conversion module group comprising: a plurality of photoelectric conversion modules; a linking portion that is flexible and that mechanically and electrically connects two adjacent photoelectric conversion modules among the plurality of photoelectric conversion modules; a protective member that is flexible and that covers at least one of a front surface and a rear surface of the linking portion; and one or more reinforcing members that are rigid and that partially cover the photoelectric conversion modules, wherein in a case in which a reinforcing member is present at a rear surface of any of the photoelectric conversion modules, the rear surface includes an exposed surface region that is not covered by the reinforcing member. In this manner, the presently disclosed photoelectric conversion module group has a configuration in which the rigid reinforcing members cover the photoelectric conversion modules, but only cover part and not the whole of the photoelectric conversion modules, and in which the rear surfaces of the photoelectric conversion modules are each required to include an exposed surface region that is not covered by the reinforcing members. Therefore, a balance of high levels of mechanical strength improvement and weight reduction can be achieved when thin photoelectric conversion modules are used.

In the presently disclosed photoelectric conversion module group, the reinforcing members preferably cover at least one of a peripheral part of a front surface and a peripheral part of a rear surface of any of the photoelectric conversion modules. Through this configuration, a balance of high levels of mechanical strength improvement and weight reduction can be achieved without covering the whole surface of the photoelectric conversion modules.

In the presently disclosed photoelectric conversion module group, adjacent photoelectric conversion modules are preferably covered by the reinforcing members at peripheral parts of opposite surfaces relative to one another. This configuration enables uniform photoelectric conversion module positioning and uniform linking portion bending when the photoelectric conversion module group is folded.

In the presently disclosed photoelectric conversion module group, the reinforcing members preferably cover a side surface part of any of the photoelectric conversion modules. Through this configuration, the mechanical strength of the photoelectric conversion modules can be improved without increasing the overall thickness of the photoelectric conversion module group.

In the presently disclosed photoelectric conversion module group, the reinforcing members preferably include an opening or a notch at a side surface part of any of the photoelectric conversion modules that faces an adjacent photoelectric conversion module. Through this configuration, the linking portion and the photoelectric conversion module can be directly electrically connected and made electrically continuous through the opening or notch because the side surface part of the photoelectric conversion module is partially exposed.

In the presently disclosed photoelectric conversion module group, the reinforcing members are preferably made of a metal material. This enables the reinforcing members can achieve both rigid and thin. (Advantageous Effect)

The presently disclosed photoelectric conversion module group enables a balance of high levels of mechanical strength improvement and weight reduction when thin photoelectric conversion modules are used.

BRIEF DESCRIPTION OF THE DRAWINGS

In the accompanying drawings:

FIGS. 5A and 5B illustrate examples of configuration of a linking portion that connects adjacent photoelectric conversion modules;

DESCRIPTION OF EMBODIMENTS

The following provides a description of disclosed embodiments with reference to the drawings.

Figure 1:
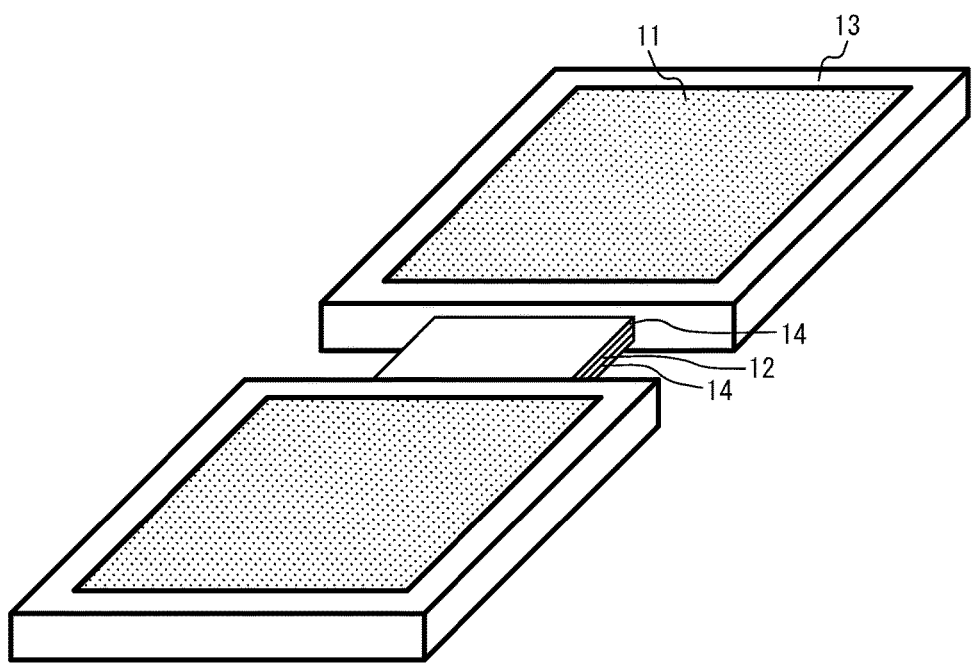
FIG. 1 is a perspective view illustrating the main aspects of configuration of a photoelectric conversion module group according to a disclosed embodiment.

FIG. 1 is a perspective view illustrating the main aspects of configuration of a photoelectric conversion module group 10 according to one disclosed embodiment. The photoelectric conversion module group 10 according to the present embodiment forms a photoelectric conversion device in combination with a main body part (not illustrated) through connection (attachment) to the main body part. The photoelectric conversion module group 10 is configured to generate electrical power through photoelectric conversion and supply the generated electrical power to the main body part of the photoelectric conversion device.

The photoelectric conversion module group 10 illustrated in FIG. 1 includes photoelectric conversion modules 11, a linking portion 12, reinforcing members 13, and a linking portion cover (protective member) 14.

The photoelectric conversion modules 11 include solar cells that photoelectrically convert incident light, such as sunlight or room light, and output electrical power.

In terms of type, solar cells are broadly classified as inorganic solar cells in which an inorganic material is used and organic solar cells in which an organic material is used. Examples of inorganic solar cells include Si solar cells in which Si is used and compound solar cells in which a compound is used. Examples of organic solar cells include thin-film solar cells such as small molecule vapor deposition-type solar cells in which an organic pigment is used, polymer coating-type solar cells in which a conductive polymer is used, and coating-conversion-type solar cells in which a conversion-type semiconductor is used; and dye-sensitized solar cells formed from titania, an organic dye, and an electrolyte. Other examples of solar cells include organic/inorganic hybrid solar cells and solar cells in which a perovskite compound is used. Herein, any of these types of solar cells can be used. However, in general, organic solar cells can be provided with a thin, flexible, and light-weight configuration and are suitable for use. Herein, thin photoelectric conversion modules are used because this enables reduction of thickness and weight of the overall device in a folded state. The thickness of a module is the thickness between electrode substrates of a solar cell, inclusive of the thickness of the electrode substrates themselves. For example, a module thickness of 3 mm or less is appropriate from a viewpoint of production techniques. The module thickness has a lower limit of approximately 10 μm.

In the photoelectric conversion module group 10 illustrated in FIG. 1, two photoelectric conversion modules 11 are arranged in a specific direction with spacing therebetween. It should be noted that although FIG. 1 illustrates an example in which the number of photoelectric conversion modules 11 included in the photoelectric conversion module group 10 is two, this is not a limitation. The number of photoelectric conversion modules 11 included in the photoelectric conversion module group 10 may alternatively be three or more.

The linking portion 12 mechanically and electrically connects the two adjacently positioned photoelectric conversion modules 11. The linking portion 12 includes a flexible conductive member, and mechanically and electrically connects the two photoelectric conversion modules 11. The conductive member may, for example, be a metal wire, a flexible printed circuit (FPC), a flat cable, or the like.

The conductive member of the linking portion 12 may, for example, be electrically and mechanically connected to the photoelectric conversion modules 11 through a conductive adhesive. Moreover, the conductive member of the linking portion 12 may be electrically connected to the photoelectric conversion modules 11 by being brought into contact and made electrically continuous with the photoelectric conversion modules 11 without using a conductive adhesive.

As a result of the linking portion 12 connecting the two photoelectric conversion modules 11 without using a hinge, thickness-reduction of the overall device when the photoelectric conversion module group 10 is folded can be achieved.

The reinforcing members 13 are rigid members that partially cover the photoelectric conversion modules 11 and improve warp resistance of the photoelectric conversion modules 11. In order words, the reinforcing members 13 improve the mechanical strength of the photoelectric conversion modules 11.

Figure 15:
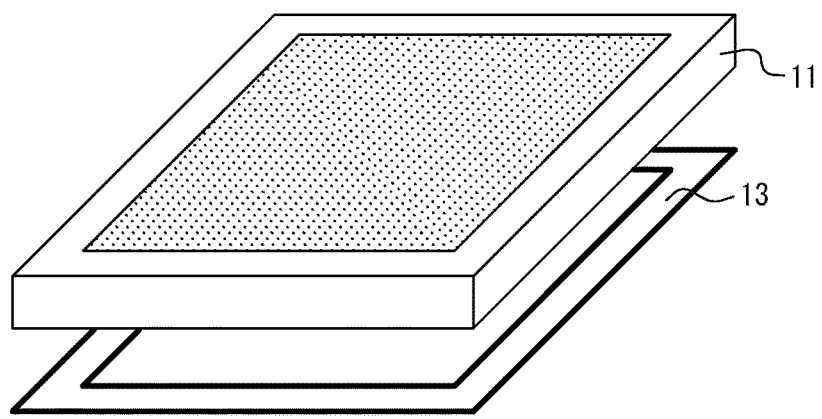
FIG. 15 illustrates an example in which a reinforcing member has a picture frame-like shape.
Figure 16:
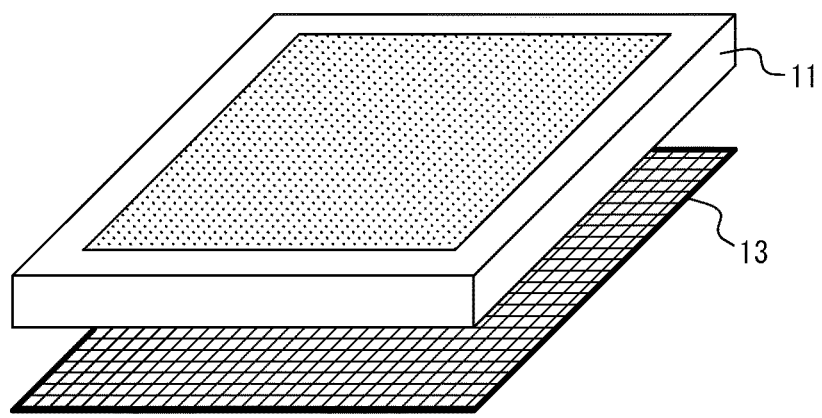
FIG. 16 illustrates an example in which a reinforcing member has a net-like shape.

The reinforcing members 13 partially cover the photoelectric conversion modules 11 and do not fully cover the photoelectric conversion modules 11. In a case in which a reinforcing member 13 is present at a rear surface (bottom surface) of any of the photoelectric conversion modules 11, it is essential that the rear surface includes an exposed surface region that is not covered by the reinforcing member 13. The reinforcing member 13 may be present at a peripheral part of a light-receiving surface of the photoelectric conversion module 11, at a side surface of the photoelectric conversion module 11, and/or at the rear surface of the photoelectric conversion module 11. Of course, the reinforcing member 13 may be freely provided at a combination of locations, such as in a combination of reinforcement of the peripheral part of the light-receiving surface and reinforcement of the side surface. In a case in which the reinforcing member 13 is present at the rear surface, a picture frame-like shaped reinforcing member 13 may cover just a peripheral part of the rear surface as illustrated in FIG. 15 or a net-shaped reinforcing member 13 may be used as illustrated in FIG. 16 such that the rear surface includes an exposed surface region. Through such a configuration, the reinforcing member 13 can be made lighter than in a case in which the reinforcing member 13 covers the entire bottom surface of the photoelectric conversion module 11, which enables weight reduction of the photoelectric conversion module group 10 as a whole. Note that in FIGS. 15 and 16, the reinforcing member 13 is illustrated in a disassembled and separated state from the photoelectric conversion module 11 in order to illustrate configuration of the reinforcing member 13.

Figure 14:
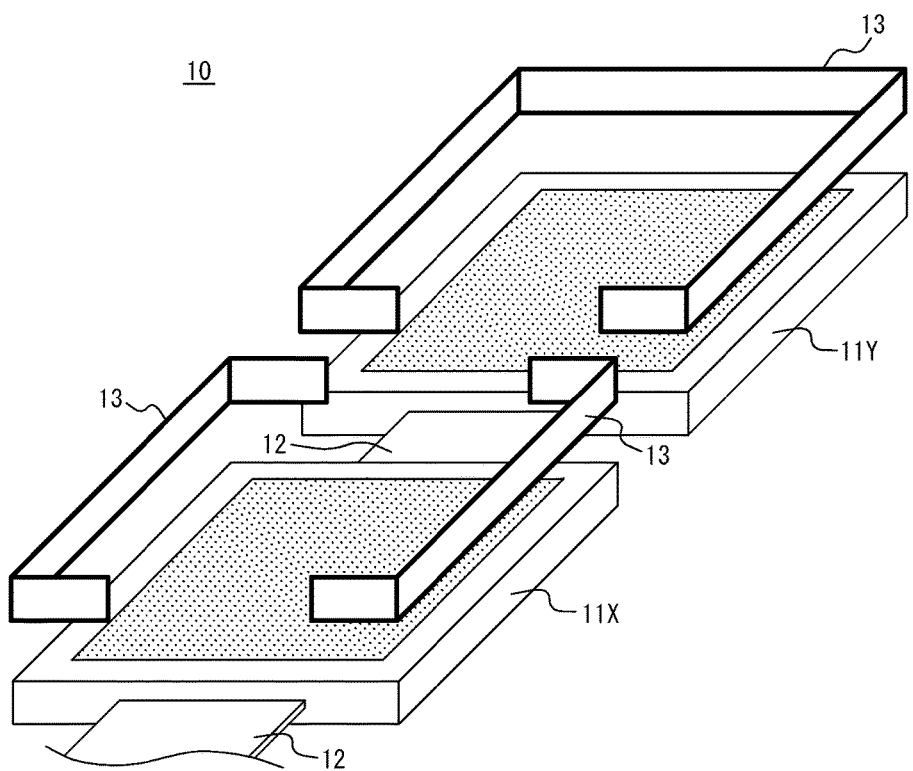
FIG. 14 illustrates an example in which the shape of reinforcing members differs for each photoelectric conversion module.

A reinforcing member 13 is disposed on each of the photoelectric conversion modules 11. Also note that the shape of the reinforcing members 13 may differ for each of the photoelectric conversion modules 11. For example, the shape of the reinforcing members 13 may differ as illustrated in FIG. 14 for a photoelectric conversion module 11X that has two photoelectric conversion modules adjacent thereto and a photoelectric conversion module 11Y that is at an end position. Note that the reinforcing members 13 are illustrated in a disassembled and separated state from the photoelectric conversion modules 11X and 11Y in FIG. 14 in order to facilitate understanding of configuration of the reinforcing members 13. Although FIG. 14 illustrates a case in which each of the reinforcing members 13 only covers a side surface part of the corresponding photoelectric conversion module 11, this may be freely combined with reinforcement of a peripheral part of the light-receiving surface or partial reinforcement of the rear surface.

The reinforcing members 13 may cover the photoelectric conversion modules 11 in various forms. In the example illustrated in FIG. 1, each of the reinforcing members 13 covers a peripheral part of a front surface (light-receiving surface) and a peripheral part of a rear surface (not illustrated) of the corresponding photoelectric conversion module 11 in a picture frame-like shape, and also covers a side surface part of the corresponding photoelectric conversion module 11 such as to have a frame-like shape. However, the shape of the reinforcing members 13 is not limited to that illustrated in FIG. 1. Other examples of shapes of the reinforcing members 13 are illustrated in subsequent drawings.

The reinforcing members 13 may be made from any material so long as they are rigid members. Examples of materials that can be used include metals, rigid resins, fiber-reinforced plastics (FRPs), and rigid substrates. Metals are particularly preferable as the material of the reinforcing members 13 in terms of enabling a balance of both rigidity and thinness.

The reinforcing members 13 may or may not be joined to the photoelectric conversion modules 11. In a case in which the reinforcing members 13 and the photoelectric conversion modules 11 are joined, each of the photoelectric conversion modules 11 may, for example, be fitted into a frame-shaped reinforcing member 13. Moreover, the reinforcing members 13 may be adhered to the photoelectric conversion modules 11. In a case in which the reinforcing members 13 and the photoelectric conversion modules 11 are not joined, each of the reinforcing members 13 may be secured by sandwiching between the corresponding photoelectric conversion module 11 and a linking portion cover 14 that covers the entire photoelectric conversion module 11.

The linking portion cover 14 is a flexible protective member. The linking portion cover 14 covers at least one of a front surface and a rear surface of the linking portion 12 and protects the linking portion 12 from external impact, scratching, moisture, and the like. The material of the linking portion cover 14 can be freely selected from materials that have a protective effect and examples thereof include cloth, elastomers, and resins. FIG. 1 illustrates an example in which the linking portion cover 14 covers both the front surface and the rear surface of the linking portion 12.

In a situation in which the linking portion cover 14 only covers one surface of the linking portion 12, the linking portion cover 14 covers a surface that becomes an inner surface when the photoelectric conversion module group 10 is folded. Through this configuration, it is possible to ensure the required curvature of the linking portion 12 when the photoelectric conversion module group 10 is folded and prevent breaking of the linking portion 12. The linking portion cover 14 is preferably of an appropriate thickness for ensuring the required curvature.

The linking portion 12 and the linking portion cover 14 may or may not be joined together. In a case in which the linking portion 12 and the linking portion cover 14 are joined, the linking portion 12 and the linking portion cover 14 may, for example, be adhered using an adhesive. Alternatively, the linking portion cover 14 may be fused to the linking portion 12, or conversely, the linking portion 12 may be fused to the linking portion cover 14. In a case in which the linking portion 12 and the linking portion cover 14 are not joined, a configuration may be adopted in which, for example, the linking portion 12 is positioned inside a linking portion cover 14 formed in bag-like shape.

Figure 2:
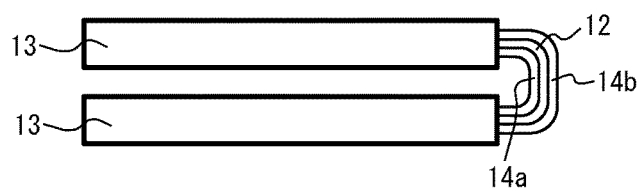
FIG. 2 is a side surface view illustrating the photoelectric conversion module group illustrated in FIG. 1 in a folded state.

FIG. 2 is a side surface view illustrating the photoelectric conversion module group 10 in a folded state. Note that the photoelectric conversion modules 11 are positioned inward of the reinforcing members 13 in FIG. 2 and are not visible since the side surface parts thereof are covered by the reinforcing members 13.

In the example illustrated in FIG. 2, the linking portion cover 14 (14a, 14b) covers both the front surface and the rear surface of the linking portion 12. In this configuration, the photoelectric conversion module group 10 can be folded such that the linking portion cover 14a becomes positioned at the inner side and can also be folded such that the linking portion cover 14b becomes positioned at the inner side. The required curvature of the linking portion 12 can be ensured in both folding directions.

Figure 3:
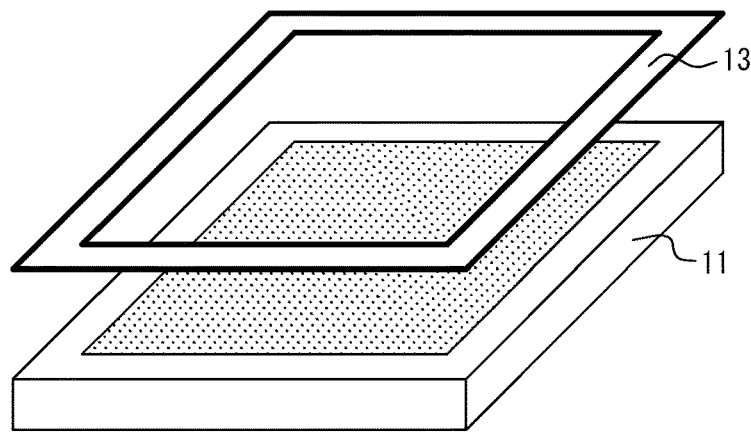
FIG. 3 is a perspective view illustrating a photoelectric conversion module and a reinforcing member in disassembled form.

FIG. 3 is a perspective view illustrating a photoelectric conversion module 11 and a reinforcing member 13 in disassembled form.

In the example illustrated in FIG. 3, the reinforcing member 13 only covers a peripheral part of a light-receiving surface of the photoelectric conversion module 11 in a border-like shape. The reinforcing member 13 may be configured as illustrated in FIG. 3 such as to only cover the light-receiving surface of the photoelectric conversion module 11. This configuration enables further weight reduction of the photoelectric conversion module group 10. Moreover, by covering the peripheral part of the light-receiving surface of the photoelectric conversion module 11 with the reinforcing member 13, this prevents the light-receiving surface of the photoelectric conversion module 11 from coming into contact with another photoelectric conversion module 11 and being scratched when the photoelectric conversion module group 10 is folded.

Figure 4:
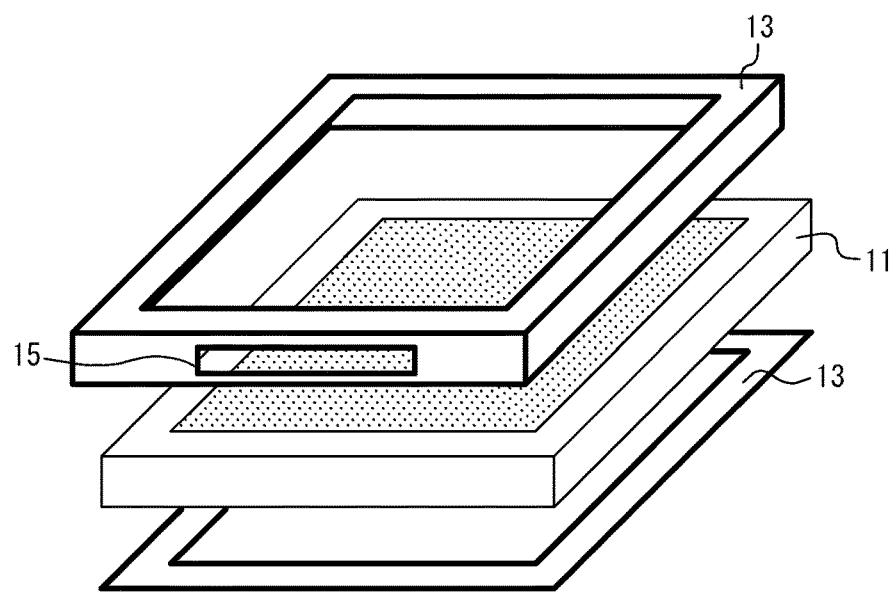
FIG. 4 illustrates an example of the appearance of covering of a photoelectric conversion module by a reinforcing member.

FIG. 4 illustrates an example in which a reinforcing member 13 covers a peripheral part of a light-receiving surface, a side surface part, and a peripheral part of a rear surface of a photoelectric conversion module 11 in a frame-like shape. By providing frame-shaped reinforcing members 13 such as illustrated, warp resistance can be improved while maintaining the lightness and thinness of the photoelectric conversion module group 10. Note that in FIG. 4, the reinforcing member 13 is illustrated in a disassembled and separated state from the photoelectric conversion module 11 in order to illustrate the structure of the reinforcing member 13. However, the shapes of components of the frame when the frame is disassembled that is not necessarily as illustrated in FIG. 4 and may be freely selected.

In the example illustrated in FIG. 4, the reinforcing member 13 includes an opening 15 at a side surface part of the photoelectric conversion module 11 that faces another photoelectric conversion module 11. Through partial exposure of the side surface part of the photoelectric conversion module 11 in this manner, the linking portion 12 and the photoelectric conversion module 11 can be directly electrically connected and made electrically continuous through the opening 15. Also note that a notch may be provided instead of the opening 15 illustrated in FIG. 4, and the linking portion 12 and the photoelectric conversion module 11 may be directly electrically connected at the notch. Moreover, the reinforcing member 13 may be provided with a connector instead of the opening 15 or the notch, and the photoelectric conversion module 11 and the linking portion 12 may be electrically connected by connecting the photoelectric conversion module 11 and the connector and by connecting the connector and the linking portion 12.

The linking portion 12 can connect two adjacent photoelectric conversion modules 11 through various configurations. Two examples of configuration of the linking portion 12 are described with reference to FIGS. 5A and 5B.

FIG. 5A illustrates a configuration in which the linking portion 12 has a flat shape and is connected to two adjacent photoelectric conversion modules 11 at facing side surface parts thereof. Note that the linking portion cover 14 is omitted in the example illustrated in FIG. 5A to facilitate viewing of the linking portion 12. The linking portion cover 14 is also omitted in FIG. 5B.

FIG. 5B illustrates a configuration in which the linking portion 12 has a wire-like shape, and instead of connecting to two adjacent photoelectric conversion modules 11 at facing surface parts thereof, connects to the photoelectric conversion modules 11 at side surface parts that are adjacent to these facing side surface parts. In the example illustrated in FIG. 5B, the two photoelectric conversion modules 11 are connected by two linking portions 12.

Next, examples of configuration of the linking portion cover 14 are described with reference to FIGS. 6A and 6B. The linking portion cover 14 can cover the linking portion 12 in various configurations.

Figure 6A:
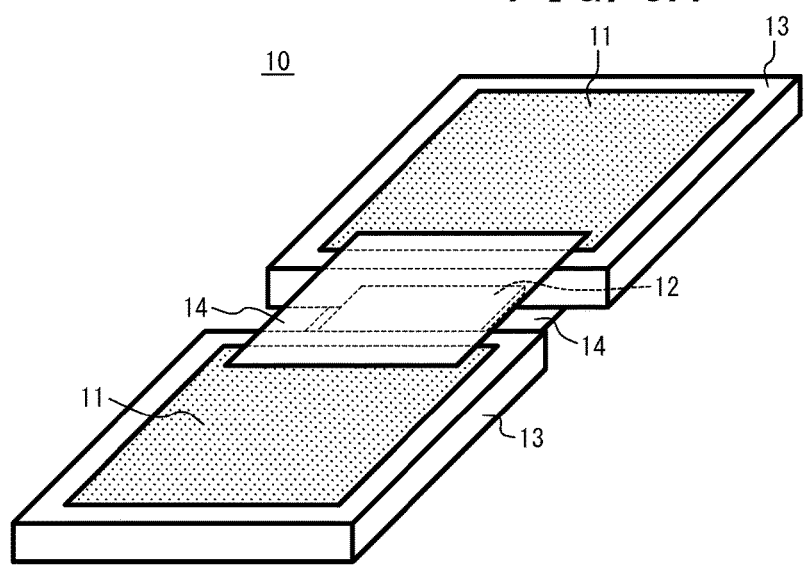
FIGS. 6A and 6B illustrate examples of configuration of a linking portion cover that covers a linking portion.

The example illustrated in FIG. 6A is a configuration in which the linking portion cover 14 covers the whole of the linking portion 12 and only covers parts of the photoelectric conversion modules 11 (and the reinforcing members 13) that are near the linking portion 12. This configuration has an effect of reducing restriction on the photoelectric conversion modules 11 during folding and facilitating tracking of displacement of the photoelectric conversion modules 11 during folding.

Figure 6B:
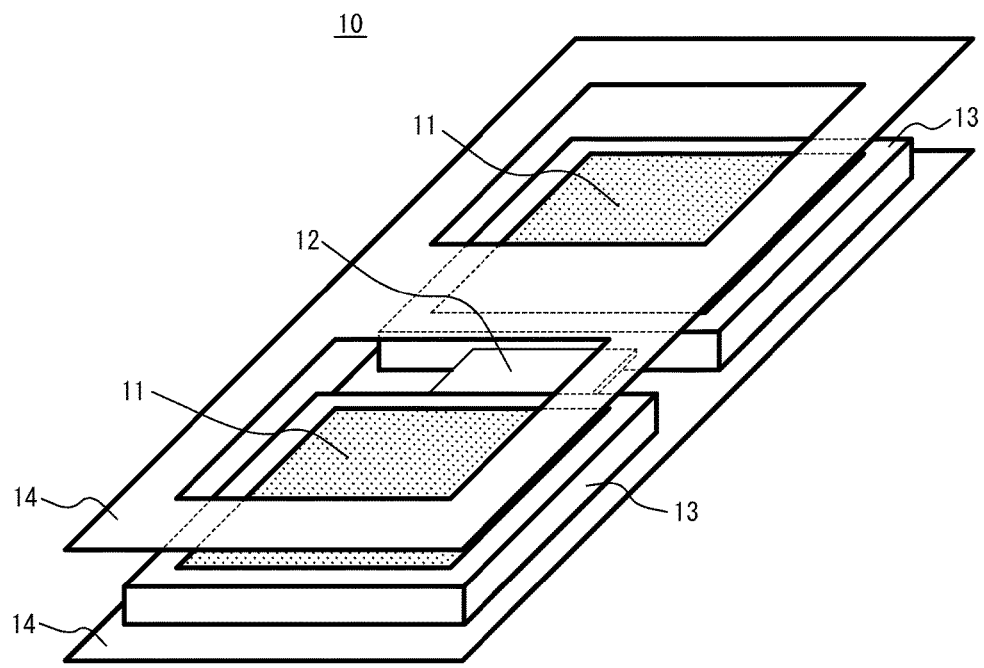

The example illustrated in FIG. 6B is a configuration in which the linking portion cover 14 covers the whole of the linking portion 12 and covers the whole of a peripheral part of each of the photoelectric conversion modules 11 (and reinforcing members 13). This configuration has an effect of distributing stress imparted on the linking portion 12 during folding. Note that in FIG. 6B, the linking portion cover 14 at the light-receiving surface side is illustrated in a separated state from the photoelectric conversion modules 11 to facilitate viewing of the structure.

Through a configuration in which the linking portion cover 14 covers parts at which the photoelectric conversion modules 11 and the linking portion 12 are connected as illustrated in FIGS. 6A and 6B, the strength of mechanical connection of the photoelectric conversion modules 11 and the linking portion 12 can be increased.

Figure 7:
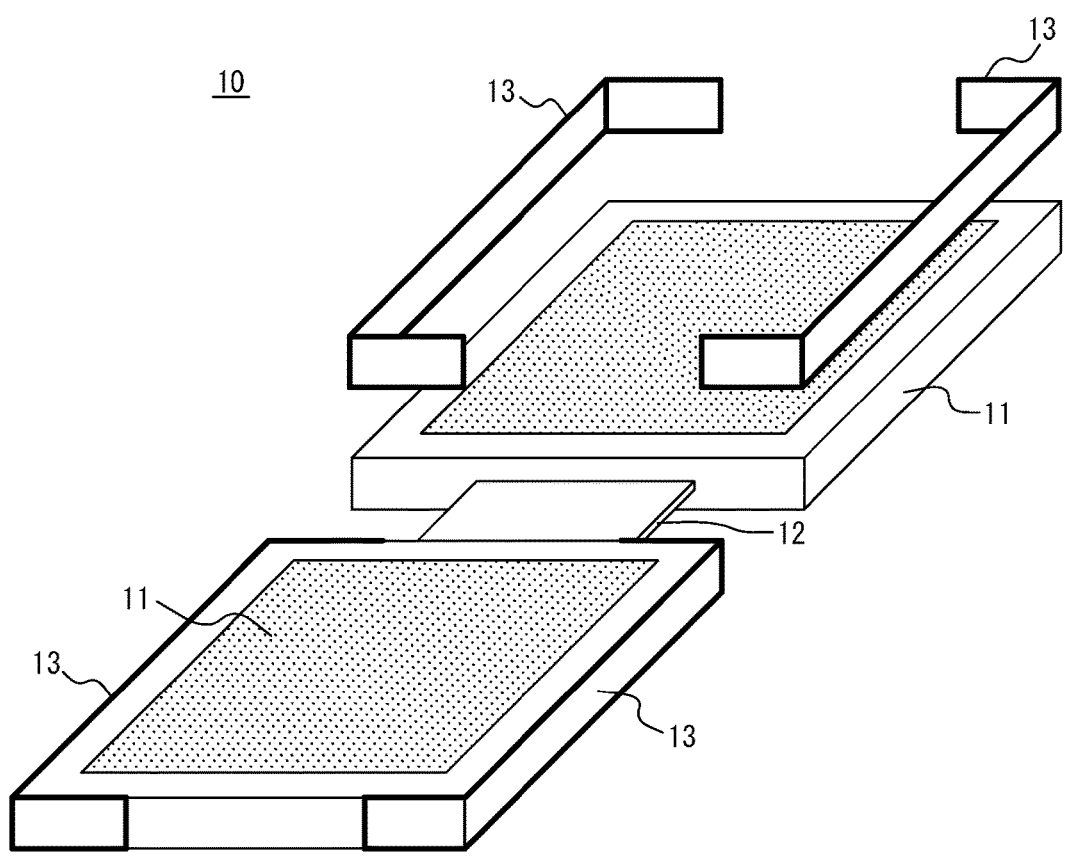
FIG. 7 illustrates an example of configuration of reinforcing members.

Next, a case in which the reinforcing members 13 only cover the side surface parts of the photoelectric conversion modules 11 is described with reference to FIG. 7. Note that FIG. 7 illustrates a state in which a reinforcing member 13 for a far-side photoelectric conversion module 11 is disassembled and separated therefrom in order to facilitate understating of configuration of the reinforcing members 13. Furthermore, the linking portion cover 14 is omitted in FIG. 7.

The example illustrated in FIG. 7 is a configuration in which the reinforcing members 13 only cover the side surface parts of the photoelectric conversion modules 11, and thus in which the front and rear surfaces of the photoelectric conversion modules 11 are not covered. This configuration enables improvement of warp resistance of the photoelectric conversion modules 11 without increasing the overall thickness of the photoelectric conversion module group 10.

Figure 8:
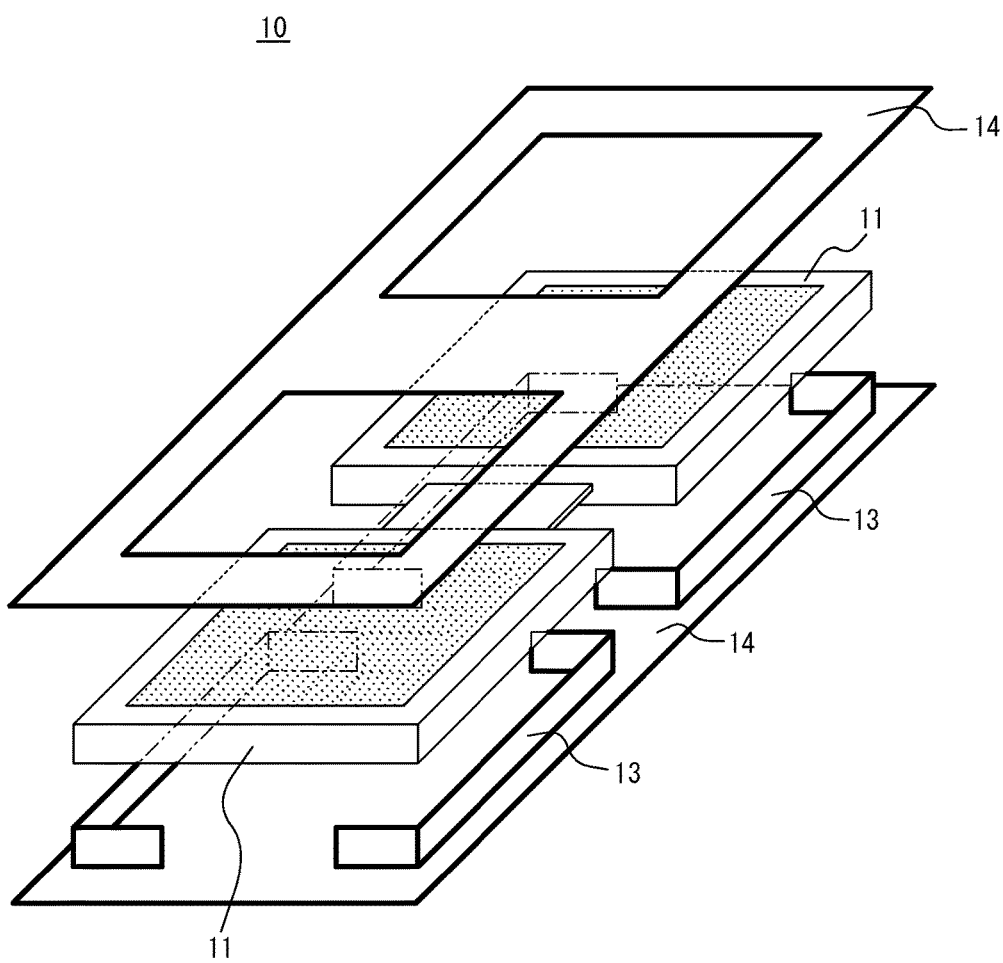
FIG. 8 is a perspective view illustrating, in disassembled form, elements of a photoelectric conversion module group in which the reinforcing members illustrated in FIG. 7 are used.

Moreover, in the case of the configuration illustrated in FIG. 7, the photoelectric conversion modules 11 and the reinforcing members 13 can be assembled in assembly of the photoelectric conversion module group 10 simply by fitting the photoelectric conversion modules 11 into the reinforcing members 13 as illustrated in FIG. 8, which has an effect of improving productivity.

Figure 9:
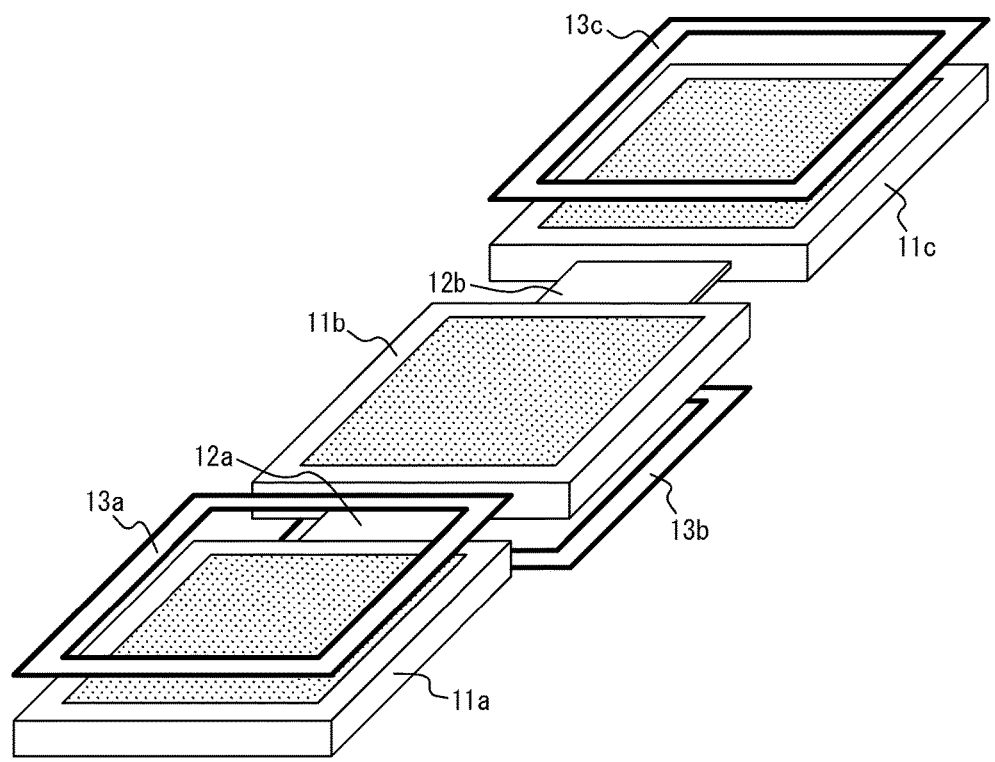
FIG. 9 illustrates the appearance in a case in which reinforcing members are disposed alternately on front and rear surfaces of photoelectric conversion modules.

Next, another example of covering of the photoelectric conversion modules 11 by the reinforcing members 13 is described with reference to FIG. 9. Note that FIG. 9 illustrates a state in which the reinforcing members 13 are disassembled and separated from the photoelectric conversion modules 11 to facilitate understanding of configuration of the reinforcing members 13. Furthermore, the linking portion cover 14 is omitted in FIG. 9.

In the example illustrated in FIG. 9, photoelectric conversion modules 11a, 11b, and 11c are arranged in this order. A linking portion 12a connects the photoelectric conversion module 11a and the photoelectric conversion module 11b, and a linking portion 12b connects the photoelectric conversion module 11b and the photoelectric conversion module 11c.

In the case of the photoelectric conversion modules 11a and 11c, reinforcing members 13a and 13c cover peripheral parts of the front surfaces of the photoelectric conversion modules 11a and 11c, respectively, in a picture frame-like shape. On the other hand, in the case of the photoelectric conversion module 11b that is adjacent to the photoelectric conversion modules 11a and 11c, a reinforcing member 13b covers a peripheral part of the rear surface of the photoelectric conversion module 11b in a picture frame-like shape.

Figure 10:
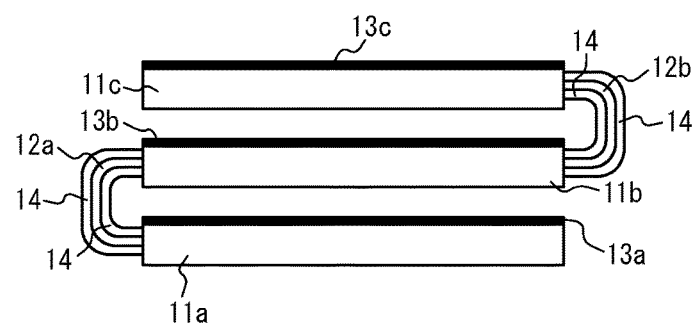
FIG. 10 is a side surface view illustrating the photoelectric conversion module group illustrated in FIG. 9 in a folded state.

FIG. 10 illustrates the photoelectric conversion module group 10 illustrated in FIG. 9 in a folded state. A configuration in which front and rear surfaces of photoelectric conversion modules 11 are alternately covered by picture frame-like shaped reinforcing members 13 in this manner enables uniform positioning of the photoelectric conversion modules 11 and uniform bending of the linking portions 12 when the photoelectric conversion module group 10 is folded. Moreover, this configuration ensures that there is always a reinforcing member 13 positioned between two photoelectric conversion modules 11 in a folded state, and thus direct contact between surfaces of the photoelectric conversion modules 11 can be avoided. Therefore, it is possible to prevent the surfaces of the photoelectric conversion modules 11 from rubbing against or becoming attached to one another.

Next, other shapes for the photoelectric conversion modules 11 and other examples of connection of the photoelectric conversion module group 10 are described with reference to FIGS. 11, 12A, 12B, and 13. Note that the linking portion cover 14 is omitted in FIGS. 11, 12A, 12B, and 13.

Figure 11:
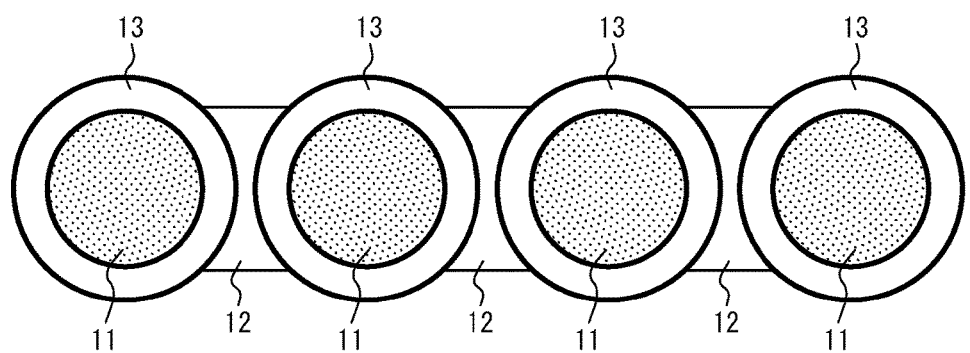
FIG. 11 illustrates a modified example of photoelectric conversion module shape.

The photoelectric conversion modules 11 may have various shapes and are not limited to having a rectangular (square) shape. For example, the photoelectric conversion modules 11 may have a circular shape as illustrated in FIG. 11. Alternatively, the photoelectric conversion modules 11 may have a honeycomb shape as illustrated in FIGS. 12A and 12B.

In a case in which the photoelectric conversion modules 11 are circular as illustrated in FIG. 11, the reinforcing members 13 have a shape in accordance therewith and may, for example, each have a shape that covers a peripheral part of a corresponding one of the circular photoelectric conversion modules 11.

Figure 12A:
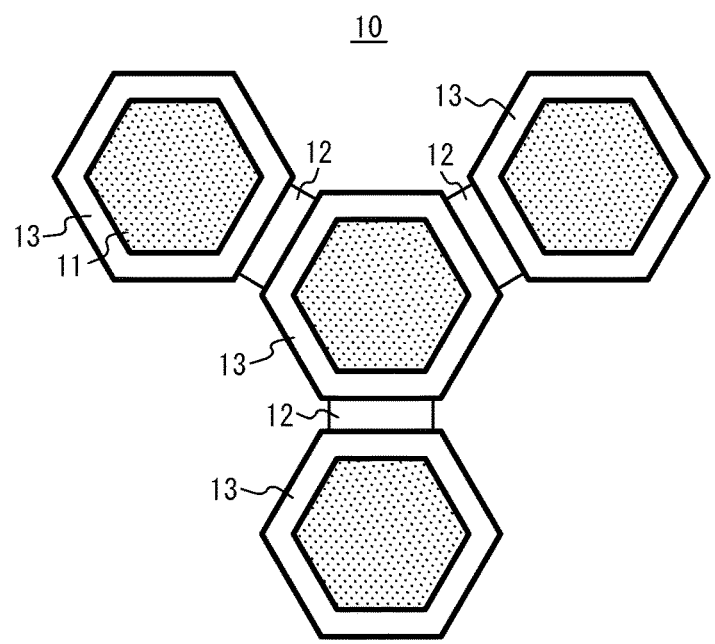
FIGS. 12A and 12B illustrate another modified example of photoelectric conversion module shape.
Figure 12B:
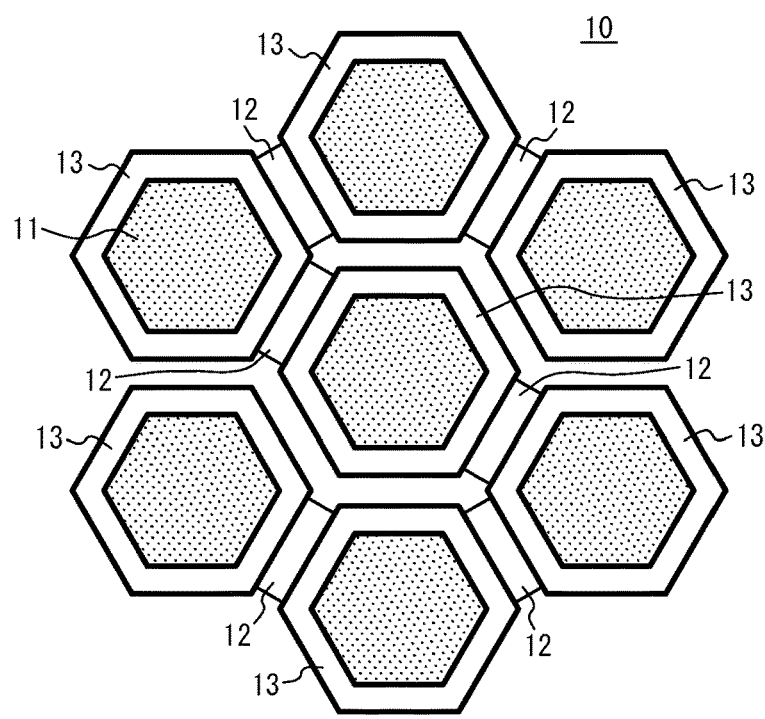

In a case in which the photoelectric conversion modules 11 have a honeycomb shape as illustrated in FIGS. 12A and 12B, the reinforcing members 13 have a shape in accordance therewith and may, for example, each have a shape that covers a peripheral part of a corresponding one of the honeycomb-shaped photoelectric conversion modules 11.

The photoelectric conversion modules 11 can be joined in various configurations as illustrated in FIGS. 12A and 12B. FIG. 12A illustrates an example of a configuration in which the honeycomb-shaped photoelectric conversion modules 11 are linked in a radial shape. FIG. 12B illustrates an example of a configuration in which the honeycomb-shaped photoelectric conversion modules 11 are linked in a twisting shape rather than a linear shape.

Figure 13:
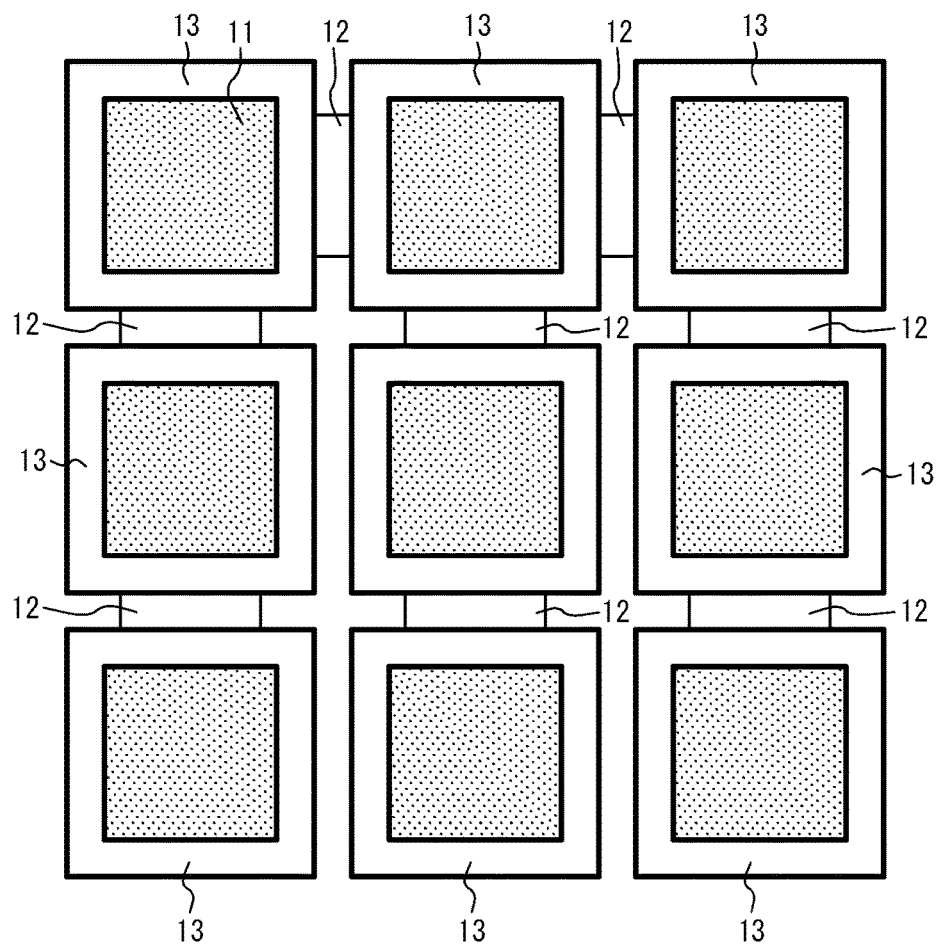
FIG. 13 illustrates an example of arrangement of a photoelectric conversion module group.

FIG. 13 illustrates an example of a configuration in which square-shaped photoelectric conversion modules 11 are linked in a pectinate shape rather than a linear shape.

It should be noted that although the presently disclosed photoelectric conversion module group has been described herein based on the drawings and embodiments, various modifications and revisions can easily be made by persons of ordinary skill in the technical field based on this disclosure. Therefore, such modifications and revisions should also be considered to be included within the scope of this disclosure. For example, the functions of blocks, or the like, may be rearranged so long as no logical contradiction arises, and blocks may be combined as a single block or may be split up.

INDUSTRIAL APPLICABILITY

According to this disclosure, it is possible to provide a photoelectric conversion module group that enables a balance of high levels of mechanical strength improvement and weight reduction when thin photoelectric conversion modules are used.

REFERENCE SIGNS LIST 10 photoelectric conversion module group
11 photoelectric conversion module
12 linking portion
13 reinforcing member
14 linking portion cover (protective member)
15 opening

The invention claimed is:

1. A folding photoelectric conversion module group comprising:
    a plurality of photoelectric conversion modules arranged in a specific direction with spacing therebetween;
    a linking portion that is flexible and that mechanically and electrically connects two adjacent photoelectric conversion modules among the plurality of photoelectric conversion modules;
    a protective member that is flexible and that covers at least one of a front surface and a rear surface of the linking portion; and
    one or more reinforcing members that are rigid and that partially cover the photoelectric conversion modules, wherein
    in a case in which a reinforcing member is present at a rear surface of any of the photoelectric conversion modules, the rear surface includes an exposed surface region that is not covered by the reinforcing member,
    the one or more reinforcing members cover at least one of a peripheral part of a front surface and a peripheral part of a rear surface of any of the photoelectric conversion modules,
    the one or more reinforcing members cover four side surface parts of any of the photoelectric conversion modules,
    the one or more reinforcing members include an opening or a notch at one side surface part of the four side surface parts of any of the photoelectric conversion modules that faces an adjacent photoelectric conversion module, and
    the linking portion and any of the photoelectric conversion modules are directly electrically connected and made electrically continuous through the opening or the notch.

2. The photoelectric conversion module group according to claim 1, wherein
    adjacent photoelectric conversion modules are covered by the one or more reinforcing members at peripheral parts of opposite surfaces relative to one another.

3. The photoelectric conversion module group according to claim 1, wherein
    the one or more reinforcing members are made of a metal material.

4. The photoelectric conversion module group according to claim 1, wherein
    the one or more reinforcing members are frame-shaped.

5. The photoelectric conversion module group according to claim 1, wherein
    the one or more reinforcing members are net-shaped.

6. The photoelectric conversion module group according to claim 4, wherein
    each of the plurality of photoelectric conversion modules is fitted into the reinforcing member having frame shape.

7. The photoelectric conversion module group according to claim 1, wherein
   the one or more reinforcing members are adhered to any of the photoelectric conversion modules.

8. The photoelectric conversion module group according to claim 1, wherein
   further comprising a linking portion cover that covers the entire photoelectric conversion module, and wherein
   each of the one or more reinforcing members is secured by sandwiching between the corresponding photoelectric conversion module and the linking portion cover.

\* \* \* \* \*